United States Patent
Moertl et al.

(10) Patent No.: US 11,091,038 B2
(45) Date of Patent: Aug. 17, 2021

(54) TECHNIQUE FOR INSULATION MONITORING IN VEHICLES

(71) Applicant: MAN Truck & Bus AG, Munich (DE)

(72) Inventors: Alexander Moertl, Germering (DE); Markus Hubert, Munich (DE); Stefan Soboll, Dachau (DE)

(73) Assignee: MAN TRUCK & BUS AG, Munich (DE)

( * ) Notice: Subject to any disclaimer, the term of this patent is extended or adjusted under 35 U.S.C. 154(b) by 43 days.

(21) Appl. No.: 15/919,956

(22) Filed: Mar. 13, 2018

(65) Prior Publication Data
US 2018/0267094 A1    Sep. 20, 2018

(30) Foreign Application Priority Data

Mar. 15, 2017    (DE) .......................... 102017002483.9

(51) Int. Cl.
*G01R 31/12*    (2020.01)
*G01R 31/00*    (2006.01)
(Continued)

(52) U.S. Cl.
CPC .......... *B60L 3/0069* (2013.01); *B60L 3/0046* (2013.01); *B60L 3/12* (2013.01); *B60L 15/08* (2013.01);
(Continued)

(58) Field of Classification Search
CPC ............ G01R 31/02–20; G01R 27/025; G01R 31/005–007; G01R 31/12;
(Continued)

(56) References Cited

U.S. PATENT DOCUMENTS 5,065,320 A * 11/1991 Hayashi .................... B60L 3/12
                                                                    701/1
6,457,351 B1 * 10/2002 Yamamoto ........ G01M 17/0072
                                                                 73/116.05
(Continued)

FOREIGN PATENT DOCUMENTS

CN        102769428 A    11/2012
CN        108508272 A     9/2018
(Continued)

OTHER PUBLICATIONS

European Office Action issued in European Application No. 18157400.5 dated Mar. 18, 2020, 7 pages. No English translation available.
(Continued)

*Primary Examiner* — Huy Q Phan
*Assistant Examiner* — David B Frederiksen
(74) *Attorney, Agent, or Firm* — Weber Rosselli & Cannon LLP

(57)    ABSTRACT

A method and device for determining insulation resistances in a motor vehicle. The device includes a control device which, in at least two measuring intervals, controls a respective operating state of at least one power converter of the motor vehicle, which is conductively connected to the traction energy store. The device further comprises a measuring device having a measuring terminal, which is conductively connected or connectable to least one DC voltage pole of an electric traction energy store of the motor vehicle, and a ground terminal which is conductively connected or connectable to a reference potential of the motor vehicle. The measuring device, in the at least two measuring intervals, respectively measures a conductance between the measuring terminal and the ground terminal. The device further comprises a calculation device, which determines the insu- (Continued)

lation resistances as a function of the at least two measured conductances and the operating states controlled.

12 Claims, 3 Drawing Sheets

(51) Int. Cl.
*G01R 27/02* (2006.01)
*B60L 3/00* (2019.01)
*B60L 15/08* (2006.01)
*B60L 3/12* (2006.01)
*B60L 58/10* (2019.01)
*G01R 31/52* (2020.01)

(52) U.S. Cl.
CPC .............. *B60L 58/10* (2019.02); *G01R 27/02* (2013.01); *G01R 31/006* (2013.01); *G01R 31/1272* (2013.01); *B60L 2200/18* (2013.01); *B60L 2200/36* (2013.01); *B60L 2200/40* (2013.01); *B60L 2210/10* (2013.01); *B60L 2210/40* (2013.01); *B60L 2240/526* (2013.01); *B60L 2240/527* (2013.01); *B60L 2240/547* (2013.01); *B60L 2240/549* (2013.01); *G01R 27/025* (2013.01); *G01R 31/007* (2013.01); *G01R 31/52* (2020.01); *Y02T 10/64* (2013.01); *Y02T 10/70* (2013.01); *Y02T 10/72* (2013.01)

(58) Field of Classification Search
CPC ............ G01R 31/1227; G01R 31/1263; G01R 31/1272; G01R 27/02–20; B60L 58/10; B60L 3/0046; B60L 3/0069; B60L 3/12; B60L 15/08
See application file for complete search history.

(56) References Cited

U.S. PATENT DOCUMENTS

| | | | | |
|---|---|---|---|---|
| 7,994,799 B2* | 8/2011 | Tachizaki | .............. | B60L 3/0023 324/551 |
| 8,878,543 B2* | 11/2014 | Morimoto | ............. | B60L 3/0069 324/503 |
| 10,509,066 B2* | 12/2019 | Moertl | .................... | B60L 50/51 |
| 2004/0130326 A1* | 7/2004 | Yamamoto | ............ | B60L 3/0023 324/503 |
| 2008/0150549 A1* | 6/2008 | Horikoshi | .............. | G01R 31/12 324/557 |
| 2012/0112695 A1* | 5/2012 | Nishi | ...................... | B60L 58/27 320/109 |
| 2013/0015799 A1* | 1/2013 | Ayano | ....................... | B60L 3/12 318/430 |
| 2014/0191720 A1* | 7/2014 | Sugiyama | ............... | B60L 58/21 320/109 |
| 2015/0084551 A1 | 3/2015 | Hayashi et al. | | |
| 2015/0168481 A1* | 6/2015 | Hackl | .................... | G01R 31/50 324/551 |
| 2016/0181965 A1 | 6/2016 | Hayashi et al. | | |
| 2016/0200209 A1 | 7/2016 | Tabatowski-Bush et al. | | |
| 2016/0318418 A1* | 11/2016 | Tokushige | .............. | B60L 50/51 |
| 2016/0327615 A1* | 11/2016 | Wallace | ................... | B60L 11/1809 |
| 2017/0197508 A1* | 7/2017 | Kobayashi | ............ | B60L 3/0069 |

FOREIGN PATENT DOCUMENTS

| | | | | |
|---|---|---|---|---|
| DE | 102010054413 A1 * | 8/2011 | .......... | G01R 31/025 |
| DE | 102010054413 A1 | 8/2011 | | |
| DE | 102011007222 A1 | 10/2012 | | |
| DE | 102016103883 A1 | 9/2016 | | |
| DE | 102015008831 A1 | 1/2017 | | |
| DE | 102017001849 A1 | 8/2018 | | |
| EP | 1909368 A2 | 4/2008 | | |
| EP | 2605026 A1 | 6/2013 | | |
| EP | 2646841 A2 | 10/2013 | | |
| EP | 3366506 A1 | 8/2018 | | |

OTHER PUBLICATIONS

European Office Action issued in European Patent Application No. 18157400.5 dated Jan. 29, 2021. English translation not available.
Notification of First Office Action issued in Chinese Patent Application No. 201810210409 4 dated Jun. 2, 2021 with English translation.

* cited by examiner

TECHNIQUE FOR INSULATION MONITORING IN VEHICLES

BACKGROUND

The present disclosure relates to a technique for determining insulation resistances. Specifically, a device for determining insulation resistances in a vehicle and a motor vehicle equipped with such a device are described.

Motor vehicles with an electric drive train are equipped with a DC power grid, which distributes the electrical energy from a traction energy store (for example, a drive battery or a fuel cell) to electrical units, specifically to the electric drive unit of the drive train and auxiliary units of the motor vehicle. In general, the electrical units are not supplied with the DC voltage from the DC power grid, but with an alternating current, a multi-phase alternating current, a pulsed DC voltage or a DC voltage with a rating which differs from that of the DC power grid. Accordingly, power converters are arranged between the DC power grid and the respective units. The function of the power converters is the conversion of direct current from the DC power grid into the respective current profile, and vice versa, for example for the recovery of kinetic energy of the motor vehicle. Accordingly, coupled DC and AC power grids are present.

As a result of the high power demand of the electric drive system, the DC power grid and the AC power grids supplied by the latter are frequently configured in the form of a high-voltage network (for example, with voltages between 300 volts and 1000 volts) or IT (from the French "Isolé Terre" or English "insulated ground") network. In order to ensure electrical safety, particularly for vehicle passengers, during operation, the insulation resistance of the electric power grid in relation to electrical ground is monitored. If the insulation resistance falls as a result of insulation faults, a motor vehicle user can be alerted, for example, so that measures for the repair of the power grid can be implemented promptly.

Conventionally, the insulation monitoring unit is electrically connected to the DC power grid of the motor vehicle, for example within the drive battery. In the prior art, insulation monitoring devices which employ a passive measuring method are widespread, as these devices are very cost-effective. By this arrangement, the DC voltage source which is present on the DC power grid is used to drive a measuring current between the overall network and electrical ground. From the ensuing measuring current, the insulation resistance of the overall network in relation to electrical ground can be determined by a known method.

However, the passive measuring method linked to the DC power grid is inaccurate and, in many cases, systematically incorrect, as the value of the insulation resistance of the AC power grid coupled via the power converters is not correctly determined. The measuring current dictated by the insulation resistance of the AC power grid is reduced by the operation of the power converters, and is customarily changed in a temporally varying manner. Thus, the insulation resistance of the AC power grid measured using a conventional monitoring device from the DC power grid is generally significantly higher than the actual value of the insulation resistance. Consequently, there is a risk than an in-service insulation fault on the AC power grid will not be detected. In summary, conventional devices employing the passive measuring method on the DC power grid are not appropriate for the monitoring of galvanically-coupled AC power grids.

In comparison with passive measuring methods, active measuring methods, in which a time-coded voltage signal drives the measuring current, which is measured by a lock-in amplifier, are cost-intensive and, as a result of their complexity, more susceptible to errors.

Document DE 10 2010 054 413 A1 describes a method for the location of an insulation fault in a system which comprises a DC section and an AC section, incorporating an inverter. The inverter comprises power switches which, during a given measuring interval, are permanently open (freewheeling) and permanently closed (switched-through state), respectively. As such circuit states do not occur during the operation of the motor vehicle, and cannot be implemented without the restriction of vehicle operation, this method cannot be deployed during vehicle operation.

SUMMARY

The object is therefore the disclosure of a technique for determining the in-service insulation resistances of coupled DC and AC power grids.

This object is fulfilled by a device for determining insulation resistances in a motor vehicle, and a motor vehicle as described herein. According to a first aspect, a device for determining insulation resistances in a motor vehicle comprises a control device which is designed, in at least two measuring intervals, to control a respective operating state of at least one power converter of the motor vehicle, which is conductively connected to the traction energy store; a measuring device with a measuring terminal, which is conductively connected or connectable to at least one DC voltage pole of an electric traction energy store of the motor vehicle, and a ground terminal, which is conductively connected or connectable to a reference potential of the motor vehicle, wherein the measuring device is designed, in the at least two measuring intervals, to respectively measure a conductance between the measuring terminal and the ground terminal; and a calculation device, which is designed to determine the insulation resistances as a function of the at least two measured conductances and the at least two operating states controlled.

Conductance can be determined in an equivalent manner by the determination of resistance. Conductance and resistance can be mutually reciprocal.

The traction energy store can comprise a plurality of cell modules for the storage of electrical energy. The traction energy store can further comprise an intermediate circuit and/or an intermediate circuit voltage converter. The intermediate circuit voltage converter, on the input side, can be connected to the cell modules. The converter can be connected on the output side to the intermediate circuit. The DC voltage pole can be an output-side pole of the intermediate circuit.

Measurement of conductance can be executed by the measurement of overall resistance. The measuring device, in the respective measuring interval, can measure current and voltage between the measuring terminal and the ground terminal, wherein the conductance or overall resistance are calculated (for example by the measuring device or the calculation device) from the measured current and the measured voltage (for example as a ratio).

The operating state can comprise a circuit state and/or a duty factor of at least one switching element of the power converter. The operating state can be represented by a coupling factor (for example, a real number between 0 and 1). The insulation resistance determined can (for example in the case of conductance determined by the measurement) be a strictly monotonically declining function of the duty factor or the coupling factor. For example, the inverse value of the insulation resistance can be linear, both in the measured conductance and in the duty factor or coupling factor.

The duty factor controlled can be less than 100% or greater than 0%, for example greater than 10%. The coupling factor corresponding to the duty factor controlled (for example, in the case of a multiplicative association of the coupling factors with the respective conductances) can be less than 1 and greater than 0, for example greater than 0.1. The coupling factor corresponding to the duty factor detected (for example, in the case of a multiplicative association of the coupling factors with the respective resistances) can be greater than 1 and, optionally, less than 10. The duty factor controlled can be greater than a minimum value (for example 5%, 10% or 20%).

Each of the operating states controlled can be temporally constant during the respective measuring interval. The combination (or assembly) of the operating states controlled in each measuring interval can be different in each measuring interval.

The at least one power converter can comprise an inverter and/or a DC converter. Each of the power converters can incorporate field effect transistors as switching elements. The at least one power converter can respectively supply a unit of the motor vehicle, or feed back electrical energy from the latter to the DC power grid. The unit can comprise an electrical machine (drive unit and/or generator).

The reference potential can be constituted by an electrically conductive bodywork of the motor vehicle. Bodywork parts which are electrically separated by composite fibre materials can be electrically connected by grounding cables.

The control device can be designed to respectively control the operating states of a plurality of power converters in a plurality of measuring intervals. To this end, the measuring device can be configured for the measurement of conductance in each of the measuring intervals. To this end, the calculation device can be configured for the calculation, for each of the power converters (or each switching element), of an insulation resistance on the basis of the measured conductances and the operating states controlled.

One of the power converters (for example, an inverter) can be conductively connected to an electrical machine for the propulsion of the motor vehicle. Alternatively or additionally, one of the power converters (for example, a DC voltage converter) can be conductively connected to an electric drive mechanism for the power-assisted steering system of the motor vehicle. Alternatively or additionally, one of the power converters (for example, a DC voltage converter or converter device) can be conductively connected to a compressor or a pump in the motor vehicle, for example the compressor of an air-conditioning installation, the compressor for the compression of air, or the oil pump in a hydraulic system of the motor vehicle.

The function can incorporate parameters or coupling factors for the weighting of a dependence of the insulation resistance on the operating state controlled. The calculation device can incorporate a memory, in which motor vehicle-specific parameter values are saved. The function can incorporate parameters or coupling factors for the weighting of a linear dependence and/or a non-linear dependence of the insulation resistance on the operating state controlled.

The control device can define the measuring intervals in accordance with a driving state of the motor vehicle. The control device can define at least one measuring interval which precedes driving readiness being established and/or follows driving readiness of the motor vehicle being withdrawn.

According to a further aspect, a motor vehicle is provided, having a device according to the above-mentioned aspect. The motor vehicle can comprise an electric traction energy store, at least one power converter which is conductively connected to the traction energy store, and the device for determining insulation resistances in the motor vehicle.

The motor vehicle can be a utility vehicle, for example a heavy goods vehicle, or a tractor vehicle (for the conveyance of goods) and/or a bus (for the conveyance of persons), or a passenger motor vehicle.

BRIEF DESCRIPTION OF THE FIGURES

Features described above can be implemented in any combination. Further features and advantages of the present disclosure are described hereinafter with reference to the attached drawings. In the figures.

DETAILED DESCRIPTION

Figure 1:
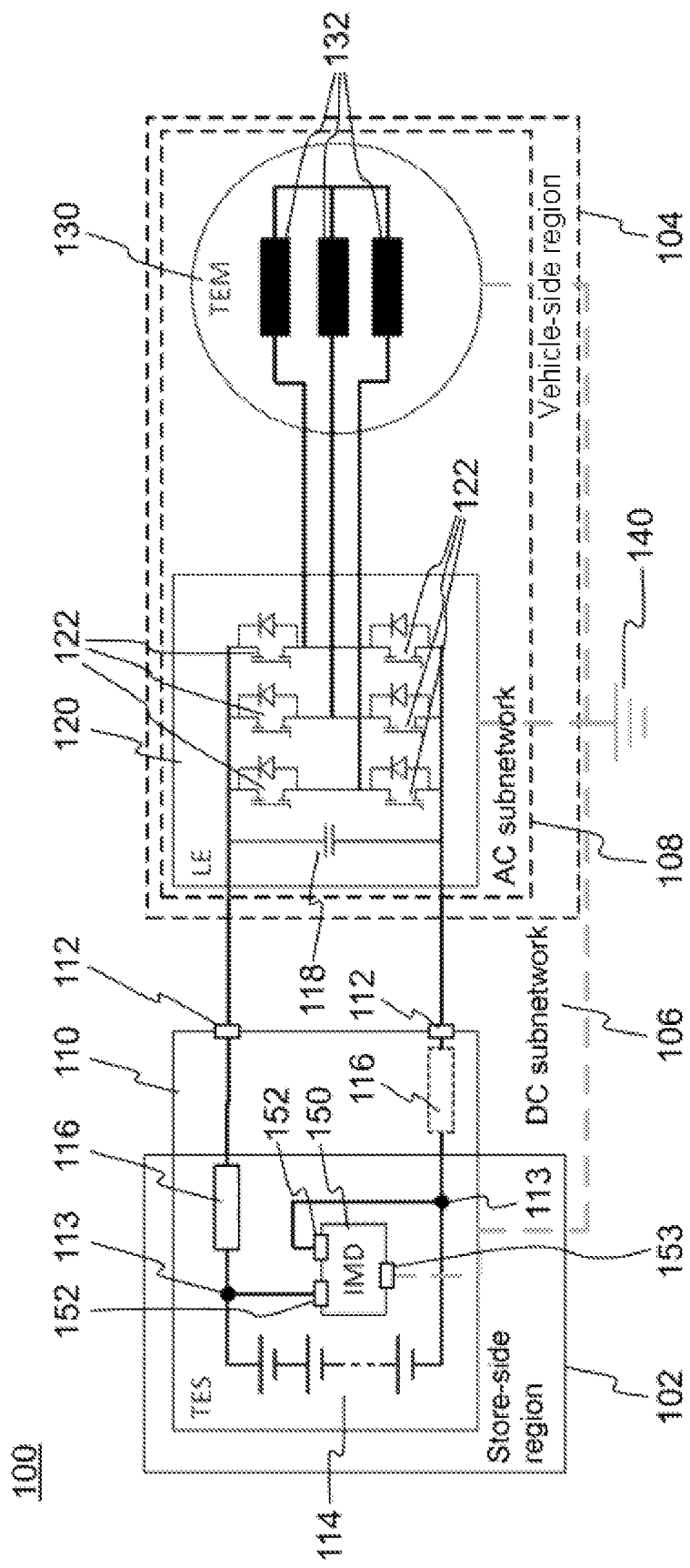
FIG. 1 shows a schematic representation of the electric power grid of a motor vehicle having a first exemplary embodiment of a device for determining insulation resistances in a motor vehicle.

FIG. 1 shows a schematic representation of an example of a motor vehicle, which is generally identified by the reference number 100, in which the present technique can be implemented. The motor vehicle 100 comprises an energy store-side region 102 and a vehicle-side region 104. The energy store-side region 102 and the vehicle-side region 104 are connected by a DC power grid 106 to which, in the vehicle-side region 104, at least one AC power grid 108 is coupled. Typically, at least one AC power grid 108 is supplied from the DC power grid 106. The coupled power grids 106 and 108 are also described as an overall network, and can be configured as an IT network.

The motor vehicle 100 comprises a traction energy store 110 for the storage of electrical energy. Said energy is delivered via DC voltage poles 112 to the DC power grid 106 (and, where applicable, in the case of energy recovery, fed to the traction energy store 110). The traction energy store 110 comprises a plurality of electrochemical cells, which are interconnected in cell modules 114, and are switchably connected to the DC voltage poles 112 via a contactor 116.

The motor vehicle 100 further comprises, in the vehicle-side region 104, at least one power converter 120 which is connected to the traction energy store 110 in an electrically conductive manner, and which respectively supplies at least one unit 130 of the motor vehicle 100 in the respective AC power grid 108. To this end, the power converter 120 comprises switching elements 122 which are respectively connected on the input side to the traction energy store 110, and on the output side to the respective unit 130 of the motor vehicle 100. Typically, an intermediate circuit 118 is connected between the cell modules 114, as the primary voltage source, and the input side of the switching elements 122, which intermediate circuit can be an element of the traction energy store 110, a stand-alone element of the DC power grid 106 or (as represented in FIG. 1) an element of the power converter 120.

The unit 130 represented in FIG. 1 comprises an electrical propulsion machine (also designated as an electric traction machine, or ETM) of the motor vehicle 100, which machine is configured as a multi-phase AC machine. The respective phases 132 are controlled by two switching elements 122, which are respectively configured as half-bridges. The multi-phase AC power grid 108 represented in FIG. 1 is exemplary only. The technique can be employed with any current profile, for example single-phase AC and/or a DC voltage controlled by pulse width modulation (or PWM). Specifically, the motor vehicle 100, from the DC power grid 106, can supply a plurality of AC power grids 108 which, for example, each deliver different current profiles for different units 130.

According to one operating state of the power converter 120, the switching elements 122 thereof assume a (generally dynamic) circuit state. The function of the switching elements 122 is in this case the conversion of the direct current tapped from the DC power grid 106 into a correspondingly constituted alternating current on the AC power grid 108 and, where applicable, vice versa, for example for energy recovery. The switching elements 122 may comprise switching semiconductor elements which, in the operation of the motor vehicle 100, in accordance with a (generally time-dependent) circuit state, are actuated at high switching frequencies, for example at least 1 kHz.

The circuit state, for example, is determined by a duty factor (also described as a pulse duty ratio). The duty factor of the switching elements 122 constitutes one example of a parameter for the operating state of the power converter 120. The duty factor is the ratio of the pulse duration with the switching element 122 closed to the period duration of the dynamic circuit state (i.e. of the reciprocal switching frequencies).

For the determination of insulation resistances of the power grids 106 and 108 in relation to an electrical ground 140 of the motor vehicle 100, for example the reference potential defined by a metal vehicle chassis, the motor vehicle 100 comprises a device 150 for determining insulation resistances in the motor vehicle 100. The device 150 can also be designated as an "Insulation Monitoring Device" (or IMD).

The first exemplary embodiment of the device 150 represented in FIG. 1 comprises at least one measuring terminal 152, which is conductively connected to at least one DC voltage pole 112 or 113 of an electric traction energy store 110. The device 150 further comprises a ground terminal 153, which is conductively connected to a reference potential 140 of the motor vehicle 100.

The device 150 can, for example, as schematically represented in FIG. 1, be arranged within the traction energy store 110. Alternatively, the device 150 can be arranged as a stand-alone unit in the DC power grid 106. Moreover, the device can be partially integrated in the traction energy store 110. Advantageously, the measuring terminal 152 is connected to a DC voltage pole 113 of the cell module 114, independently of the state of the contactor 116, for example for the determination of insulation resistances with the contactor 116 open.

For the determination of insulation resistances, the device 150 controls the operating state of the power converter 120, i.e. a circuit state defined by a temporal switching characteristic of the switching elements 122, for example an operating state of at least one switching element 122, which operating state is defined by a duty factor. In a plurality of temporally separate measuring intervals, the device 150 respectively measures the conductance between the measuring terminal 152 and the ground terminal 153. The operating state defines a circuit state or duty factor that is stationary for the respective measuring interval and dynamic in general (for example between the measuring intervals). For example, the at least one switching element 122 executes a plurality of opening and closing cycles (for example, opens and closes more than 100 or 1000 times) within a measuring interval, according to the circuit state or duty factor.

The device 150 employs the operating state of the power converter 120, i.e. the circuit state or duty factor of the switching elements 122 which connect the DC power grid 106 to the AC power grid 108, for the accurate determination of the value of the insulation resistance, including that of AC power grids 108. The circuit state or duty factor of the switching elements 122 can be actively influenced by a control device in the device 150 for the determination of insulation resistance and/or can be provided to the latter. For example, the control device comprises an interface with the power converter 120 for the control or scanning of the operating state of the power converter 120. For example, status settings or status signals are exchanged via the interface, e.g. a closed position or open position of one of the switching elements 122, or a duty factor of a semiconductor converter as the power converter 120.

Figure 2:
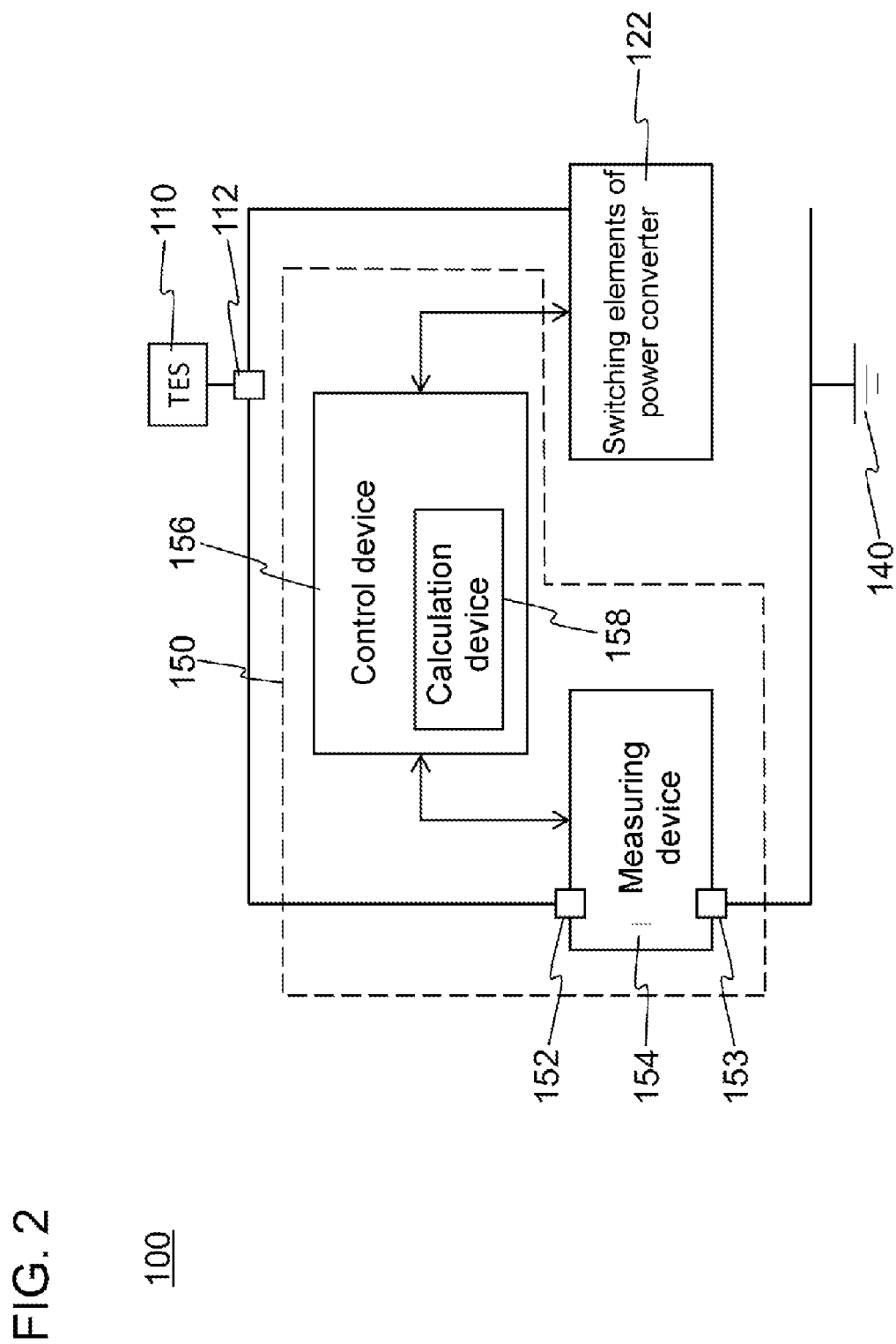
FIG. 2 shows a schematic block circuit diagram of a second exemplary embodiment of the device for determining insulation resistances in a motor vehicle.

FIG. 2 shows a schematic block circuit diagram of a second exemplary embodiment of the device 150 for the determination of insulation resistances in a motor vehicle 100. Features which are interchangeable or consistent with those of the first exemplary embodiment are identified by the same reference numbers.

The device 150 comprises a control device 156 which is designed, in at least two measuring intervals, to control a respective operating state of at least one power converter of the motor vehicle 100, which is conductively connected to the traction energy store 110, or the switching elements 122 of said power converter.

The device 150 further comprises a measuring device 154 having a measuring terminal 152, which is conductively connected to at least one DC voltage pole 112 of an electric traction energy store 110 of the motor vehicle 100, and a ground terminal 153 which is conductively connected to a reference potential 140 of the motor vehicle 100. The measuring device 154 is designed, in the at least two measuring intervals, to respectively measure at least one conductance between the measuring terminal 152 and the ground terminal 153.

To this end, the measuring device 154 can be configured in a spatially separate arrangement from other facilities in the device 150, for example within the traction energy store 110. The control device 156 can be configured as a superordinate control, which coordinates the active influencing of the operating states of the power converter 120 (for example, the circuit states or duty factors of the switching elements 122) with the measuring device 154 for the measurement of conductance.

The device 150 further comprises a calculation device 158, which is designed to determine the insulation resistances as a function of the at least two measured conductances and the at least two operating states controlled. The calculation device 158 can, as represented in FIG. 2, be an element of the control device 156.

Figure 3:
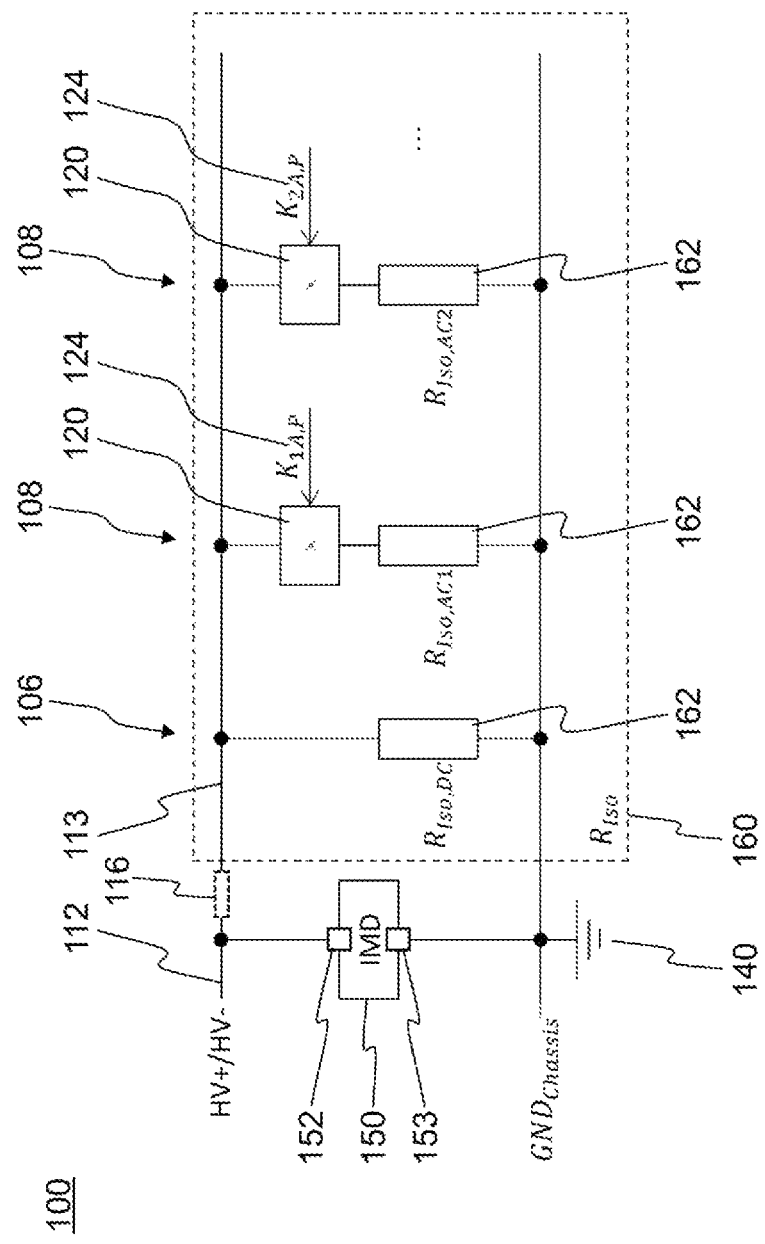
FIG. 3 shows a schematic equivalent circuit diagram for the calculation of the insulation resistances, which circuit diagram can be implemented in one of the exemplary embodiments of the device.

FIG. 3 shows an equivalent circuit diagram of the motor vehicle 100, with respect to the insulation resistance 162

(designated as $R_{Iso,DC}$) of a DC power grid 106 and the insulation resistances (designated as $R_{Iso,AC1}$ and $R_{Iso,AC2}$, respectively) of two AC power grids 108. The equivalent circuit diagram, or the corresponding calculation by the calculation device 158 can be implemented in each exemplary embodiment of the device 150. In each measuring interval, the conductance 160 is measured between the measuring terminal 152 and the ground terminal 153 (or, as an equivalent, the inverse value thereof, as a combined insulation resistance).

The respective AC power grids 108 are parallel-connected to the DC power grid 106 via the switching elements 122 of the associated power converter 120. The coupling of the AC power grids 108 via the respective power converters 120 is incorporated in the determination of the insulation resistances by means of factors $K_1$ or $K_2$ which are determined from the operating state 124 of the respective power converter 120 or switching element 122. For example, the factor $K_i$ corresponds to the duty factor of the respective power converter 120 or switching element 122.

The power converters 120 can be configured by means of a power electronic device (PE). Specifically, the power converters 120 can comprise an AC/DC converter and/or a DC/AC converter. The respective operating states 124 controlled in the at least two measuring intervals can respectively comprise an active operating state (index "A") or passive operating state (index "P"). The active operating state can comprise, for example, a duty factor of 50%, i.e. the controlled unit is in service. The passive operating state can comprise, for example, a duty factor of 0% or less than 5%, i.e. the controlled unit is not in service. The terms "active" and "passive" are exemplary designations for two different operating states.

If the switching elements 122 are completely closed for the duration of the measuring interval (e.g. in the event of an active short-circuit of the AC phases of all the converters 120, wherein the three AC phases thereof are respectively connected to one DC voltage pole, i.e. only the uppermost or only the lowermost three switching elements 122 are closed, as both DC voltage poles would otherwise be short-circuited likewise), a single measurement is sufficient for the accurate determination or evaluation of the value of the insulation resistance of the overall network. Thus, on the basis of parallel connection, it can be determined or evaluated that the insulation resistances of the individual phases (i.e. the individual values for the sub-networks) are all equal to or greater than the combined measured value for the insulation resistance. Compliance with a limiting value can thus be ensured, with no safety margin. It may be required that the resistance of the converter, in the event of an active short circuit, should be negligible, i.e. an approximation to a coupling factor equal to 1. The closing of the switching elements 122 is in this case executed in temporal coordination with the measurement.

The calculation device 158 determines the insulation resistances 162, according to the parallel connection of the electric circuits 106 and 108 in the respective operating state 124 and the measured conductance 160. The effect of the operating state 124 of the power converter 120, or the switching elements 122 thereof, (e.g. the duty factor of a converter 120) can be determined analytically or experimentally beforehand, and saved in the calculation device 158, e.g. by means of the factors $K_i$, depending on the duty factor, in the simplest form, or in the form of linear or non-linear functions (for example, in a series expansion). These functions can be determined, for example in a vehicle-specific or type-specific manner (for a serial model), prior to the manufacture of the motor vehicle 100 (for example, using a test set-up, based upon known insulation resistances in the AC power grid 108, or using a prototype of the motor vehicle 100).

For an overall network comprising a DC power grid 106 and an AC power grid 108, at least two measurements of conductance 160 must be executed, i.e. two controlled measuring intervals, with at least two different operating states 124 (for example, circuit states or duty factors of the switching elements). In general, the N insulation resistances of N AC power grids 108 and the insulation resistance of one DC power grid 106 can be determined on the basis of N+1 measurements of the conductance 160 in one measuring interval respectively, with a corresponding number N+1 of different operating states. If more than N+1 measurements are available, the calculation device 158 can execute a linear regression.

The active method operated by the control device 156 comprises the setting of different operating states 124 (for example, circuit states or duty factors) of the switching elements 122. The operating state 124 determines, for example, a time-variable actuation of the duty factor of a converter 120 for the propulsion system, of a converter 120 for power-assisted steering and/or of a converter 120 for the air-conditioning compressor.

The control device 156 actively intervenes in the operating requirements of the power converter 120 and/or the switching elements thereof for the duration of the measuring interval (e.g. 500 ms to 30 s) in order to control the operating state 124. The lengths of the measuring intervals (i.e. the measuring times) can be established on the basis of the discharge capacities of the IT-network and/or by filtering (executed by the measuring device 154).

In this case, the intervention by the control device for setting the operating states 124 can be such that there are respectively temporally constant operating states 124 (e.g. constant circuit states or constant duty factors of the switching elements 122) for the measuring interval. This facilitates the accurate determination of the value of the conductance 160, or of the corresponding combined insulation resistance.

The control device 156 may intervene shortly before driving readiness of the motor vehicle 100 is established and/or shortly after driving readiness of the motor vehicle 100 is withdrawn, in order to have as little an adverse effect as possible on the operating requirements for the power converter 120 (or the operating requirements for the switching elements 122 thereof) of the user functions (e.g. driving, cooling, power-assisted steering).

If a minimum of two measured values for the conductance 160 (for example, the combined insulation resistance) and, respectively, the operating state 124 (for example, the associated functional dependence of the insulation resistance 162 in the respective operating state 124, or values for the factors $K_i$, according to the operating state 124) are known, the calculation device 158 determines the unknown variables 162 of the insulation resistance $R_{Iso,Dc}$ in the DC power grid 106 and the respective insulation resistance $R_{Iso,ACi}$ in the i-th AC power grid 108, for example by means of regression. In principle, the calculation device 158 permits the determination of all insulation resistances 162, if the number of measurements (i.e. of measuring intervals) is greater than or equal to the number of subnetworks 106 and 108.

For example, the calculation device 158 calculates the insulation resistances 162 on the basis of the measured conductances 160 ($L_i$ or the combined insulation resistances $R_{Iso,i}=1/L_i$) and the respective coupling factors $K_i$ for operating states 124, as follows.

On the basis of, for example, N+1=3 measuring intervals, the data sets ($R_{Iso,1}$, $K_{1P}$, $K_{2P}$), ($R_{Iso,2}$, $K_{1A}$, $K_{2P}$), ($R_{Iso,3}$, $K_{1A}$, $K_{2A}$) are known. The insulation resistances 162, i.e. $R_{Iso,DC}$, $R_{Iso,AC1}$, $R_{Iso,AC2}$, for the respective power grids 106 and 108 are calculated. More specifically, the calculation device 158 determines the insulation resistances 162 as a function of the data sets, based upon functional dependencies in the respective measuring interval:

Measuring interval 1: $R_{Iso,1} = R_{Iso,DC} \| K_{1P} R_{Iso,AC1} \| K_{2P} R_{Iso,AC2} \| \ldots$ Measuring interval 2: $R_{Iso,2} = R_{Iso,DC} \| K_{1A} R_{Iso,AC1} \| K_{2P} R_{Iso,AC2} \| \ldots$ Measuring interval 3: $R_{Iso,3} = R_{Iso,DC} \| K_{1A} R_{Iso,AC1} \| K_{2A} R_{Iso,AC2} \| \ldots$ Herein, "$\|$" represents the parallel electrical connection of resistances, i.e. the sum of the inverse values of the resistances. If the data sets for N+1 measuring intervals are available to the calculation device 158, all insulation resistances 162 can be calculated (for controlled operating states that are disjunct), for example by the inversion of a matrix determined by the coupling factors. If data sets are available for more than N+1 measuring intervals, the insulation resistances 162 are determined by regression.

For example, the insulation resistances are calculated as follows:

Measuring interval 1: $R_{Iso,1} = 1/(1/R_{Iso,DC} + 1/(K_{1P} \cdot R_{Iso,AC1}) + 1/(K_{2P} \cdot R_{Iso,AC2}) + \ldots)$ Measuring interval 2: $R_{Iso,2} = 1/(1/R_{Iso,DC} + 1/(K_{1A} \cdot R_{Iso,AC1}) + 1/(K_{2P} \cdot R_{Iso,AC2}) + \ldots)$ Measuring interval 3: $R_{Iso,2} = 1/(1/R_{Iso,DC} + 1/(K_{1A} \cdot R_{Iso,AC1}) + 1/(K_{2A} \cdot R_{Iso,AC2}) + \ldots)$ Alternatively, reciprocal coupling factors (for example, in a calculation involving the conductances) can be applied:

Measuring interval 1: $G_{Iso,1} = G_{Iso,DC} + K_{1P} \cdot G_{Iso,AC1} + K_{2P} \cdot G_{Iso,AC2} + \ldots$ Measuring interval 2: $G_{Iso,2} = G_{Iso,DC} + K_{1A} \cdot G_{Iso,AC1} + K_{2P} \cdot G_{Iso,AC2} + \ldots$ Measuring interval 3: $G_{Iso,2} = G_{Iso,DC} + K_{1A} \cdot G_{Iso,AC1} + K_{2A} \cdot G_{Iso,AC2} + \ldots$ The technique can be scaled to more than one AC power grid 108 (for example, a plurality of AC machines, e.g. propulsion systems and/or auxiliary units), wherein only the number of measuring intervals required (at least N+1), for respectively different operating states 124, is increased in order to permit the determination by the device 150 of all the insulation resistances 162 in the overall network.

Whereas a distinction has been drawn heretofore between the respective association of power inverters 120 with an AC power grid 108 and the respective association of the switching elements 122 thereof with one phase of the AC power grid 108, the device 150 can also be employed for the determination of the insulation resistances of the individual phases. To this end, the approximation load impedance<<insulation resistance is applied. In this case, the terms "power inverter" 120 and "switching elements" 122 can be interchangeable.

As will be evident to a person skilled in the art from the above-mentioned exemplary embodiments, the technique permits the cost-effective determination of insulation resistances in coupled electric power grids of a motor vehicle during operation.

The technique permits the implementation of a cost-effective passive measuring method for the accurate determination of the value of the insulation resistance in coupled AC power grids. Conversely, according to the prior art, a significantly more cost-intensive, active measuring method is required for this purpose to date, involving a test voltage which is modulated according to the network voltage.

Exemplary embodiments of the technique can determine individual insulation resistance values in each subnetwork (specifically in each DC and AC power grid). Thus, by the application of the technique, the location of an insulation fault can also be advantageously determined. This facilitates fault identification and fault clearance.

The active control of respectively constant operating states during the measuring intervals (for example, circuit states or duty factors) permits accurate measurements of the values and/or improves the measuring accuracy of the accurate measurements of the value of the insulation resistance.

The operation of the DC and AC power grids (e.g. for the utility function of driving of an electric vehicle) can remain unaffected by the method, specifically wherein the measuring intervals occur before and/or after the operating phase.

Although the present disclosure has been described with reference to exemplary embodiments, it will be evident to a person skilled in the art that various modifications can be undertaken, and equivalents can be applied by way of substitution. Moreover, many modifications can be undertaken, in order to adapt a specific situation or a specific vehicle model to the teaching of the present disclosure. Consequently, the present disclosure is not limited to the exemplary embodiments disclosed, but encompasses all exemplary embodiments which fall within the scope of the attached patent claims.

LIST OF REFERENCE NUMBERS

100 Motor vehicle
102 Store-side region
104 Vehicle-side region
106 DC power grid
108 AC power grid
110 Traction energy store
112, 113 DC voltage pole
114 Cell modules
116 Contactor
118 Intermediate circuit
120 Power converter
122 Power converter switching element
124 Operating state of power converter
130 Unit
132 Phases of unit
140 Reference potential of motor vehicle
150 Device for determining insulation resistances
152 Measuring terminal
153 Ground terminal
154 Measuring device
156 Control device
158 Calculation device
160 Conductance
162 Insulation resistance

We claim:

1. A device for determining insulation resistances in coupled electric power grids in a motor vehicle, comprising:
   an active control device which is designed, to actively control a respective operating state of at least one power converter of the motor vehicle in each of at least two measuring intervals, which is conductively connected to an electric traction energy store;

a measuring device with a measuring terminal, which is conductively connected or connectable to at least one direct current (DC) voltage pole of the electric traction energy store of the motor vehicle, and a ground terminal, which is conductively connected or connectable to a reference potential of the motor vehicle, wherein the measuring device is designed, to respectively measure a conductance between the measuring terminal and the ground terminal in each of the at least two measuring intervals; and a calculation device, which is designed to determine the insulation resistances as a function of the at least two measured conductances and the at least two operating states controlled, wherein each of the at least two operating states comprises a duty factor of at least one switching element of the power converter and wherein the duty factor controlled is less than 100% and greater than 10%, and wherein the active control device defines at least one measuring interval of the at least two measuring intervals which precedes driving readiness being established and/or follows driving readiness of the motor vehicle being withdrawn.

2. The device according to claim 1, wherein each of the at least two operating states comprises a circuit state of at least one switching element of the power converter.

3. The device according to claim 2, wherein the insulation resistance determined is a strictly monotonically declining function of the duty factor.

4. The device according to claim 1, wherein each of the at least two operating states controlled in the respective measuring interval is temporally constant.

5. The device according to claim 1, wherein the at least one power converter comprises an inverter or a DC converter.

6. The device according to claim 1, wherein the at least one power converter supplies a unit of the motor vehicle.

7. The device according to claim 1, wherein the reference potential is constituted by an electrically conductive bodywork of the motor vehicle.

8. The device according to claim 1, wherein the active control device is designed to respectively control the at least two operating states of a plurality of power converters in a plurality of measuring intervals, the measuring device is designed for the measurement of conductance in each of the measuring intervals, and the calculation device is designed for the calculation, for each of the power converters, of an insulation resistance on the basis of the measured conductances and the at least two operating states controlled.

9. The device according to claim 1, wherein the function incorporates parameters for a weighting of a dependence of the insulation resistance on each of the at least two operating states controlled, and wherein the calculation device incorporates a memory, in which motor vehicle-specific parameter values are saved.

10. The device according to claim 1, wherein the function incorporates parameters for a weighting of a linear dependence or a non-linear dependence of the insulation resistance on the operating state controlled.

11. The device according to claim 1, wherein the active control device defines the measuring intervals in accordance with a driving state of the motor vehicle.

12. A motor vehicle, in particular a utility vehicle, comprising:

an electric traction energy store;

at least one power converter which is conductively connected to the electric traction energy store; and a device for determining insulation resistances in coupled electric power grids in the motor vehicle including, an active control device which is designed, to actively control a respective operating state of at least one power converter of the motor vehicle in each of at least two measuring intervals, which is conductively connected to the electric traction energy store;

a measuring device with a measuring terminal, which is conductively connected or connectable to at least one direct current (DC) voltage pole of the electric traction energy store of the motor vehicle, and a ground terminal, which is conductively connected or connectable to a reference potential of the motor vehicle, wherein the measuring device is designed, in the at least two measuring intervals, to respectively measure a conductance between the measuring terminal and the ground terminal in each of the at least two measuring intervals; and a calculation device, which is designed to determine the insulation resistances as a function of the at least two measured conductances and the at least two operating states controlled, wherein each of the at least two operating states comprises a duty factor of at least one switching element of the power converter and wherein the duty factor controlled is less than 100% and greater than 10%, and wherein the active control device defines at least one measuring interval of the at least two measuring intervals which precedes driving readiness being established and/or follows driving readiness of the motor vehicle being withdrawn.

\* \* \* \* \*